United States Patent [19]

Steger et al.

[11] Patent Number: 5,730,803
[45] Date of Patent: Mar. 24, 1998

[54] APPARATUS AND METHOD FOR TRANSFERRING HEAT FROM A HOT ELECTROSTATIC CHUCK TO AN UNDERLYING COLD BODY

[75] Inventors: Robert Steger, Cupertino; James Taoka, San Jose; Gregory Shmunis, San Carlos, all of Calif.

[73] Assignee: Applied Materials, Inc., Santa Clara, Calif.

[21] Appl. No.: 605,823

[22] Filed: Feb. 23, 1996

[51] Int. Cl.$^6$ .................................................. C23C 16/00
[52] U.S. Cl. .................. 118/723 R; 118/723 E; 118/724; 118/725; 118/728; 156/345; 29/25.01
[58] Field of Search .................. 118/723 R, 723 E, 118/724, 725, 728; 156/345; 29/25.01

[56] References Cited

U.S. PATENT DOCUMENTS 5,350,479 9/1994 Collins .................................. 118/728

*Primary Examiner*—Richard Bueker
*Attorney, Agent, or Firm*—Shirley L. Church

[57] ABSTRACT

The present invention discloses an apparatus and method for transferring heat from a hot electrostatic chuck to an underlying cold plate. Further, the overall structure of the electrostatic chuck in combination with the heat transfer apparatus of the present invention permits the thermal and pressure isolation of the high-temperature, vacuum process chamber containing the work piece processing surface of the electrostatic chuck from the low-temperature, atmospheric pressured heat transfer apparatus of the present invention.

In a preferred embodiment of the heat transfer apparatus, the apparatus comprises: an electrostatic chuck body having a buried electrode for high voltage DC and RF electrical input and a buried heating element, whereby the electrostatic chuck can be heated; a controlled heat transfer apparatus, including a heat transfer plate having a first surface in thermal contact with the electrostatic chuck body and a second surface in contact with at least one heat transfer thermal well; a cold body in thermal contact with the at least one heat transfer thermal well; and a thermal grease between the thermal well and the cold body.

33 Claims, 6 Drawing Sheets

APPARATUS AND METHOD FOR TRANSFERRING HEAT FROM A HOT ELECTROSTATIC CHUCK TO AN UNDERLYING COLD BODY

BACKGROUND OF THE INVENTION

1. Field of the Invention

The present invention pertains to an apparatus and method for transferring heat from a hot pedestal of an electrostatic chuck to an underlying cold plate. Further, the overall structure of the electrostatic chuck of the present invention permits the thermal isolation of the high-temperature, vacuum process chamber from the low-temperature, atmospheric pressured portion of the apparatus which contains the electrical connections and several heat transfer elements.

2. Brief Description of the Background Art

In the plasma processing of articles such as semiconductor wafers, a common problem is the heat generated by physical vapor deposition mechanisms which cause energy to be transferred to the article. In a high electron density plasma (HDP), RF energy is electromagnetically coupled into the "source" region of a plasma chamber to generate and maintain the high electron density of the plasma. In addition, RF "bias" energy is generally capacitively coupled in the plasma, through the article being processed, to direct the ion field toward the article (typically a semiconductor substrate).

A preferred process method used in semiconductor processing today is the "HDP/CVD" process, in which a high density plasma is used in combination with RF bias to simultaneously sputter and deposit a chemical vapor deposition dielectric layer. This processing method permits the deposition of dielectric films over metal lines without the formation of voids. The biasing energy typically is 2.5 KW or greater through the semiconductor substrate supported on an underlying electrostatic chuck. As a result of the energy transfer to the article which occurs in such a high density plasma, a typical process temperature of a semiconductor substrate, for example, is about 350° C. The transfer of heat away from the semiconductor substrate (typically a silicon wafer) becomes a serious problem. In addition, the difference in temperature between the semiconductor substrate and an underlying electrostatic chuck can reach several hundred degrees centigrade. When the semiconductor substrate is a silicon wafer, the temperature difference between the wafer and the underlying electrostatic chuck increases radially from the center of the wafer toward its edge. Since heat is transferred from the wafer to the underlying electrostatic chuck, a radial temperature differential is created on the surface of the wafer itself. This temperature differential on the wafer surface leads to non-uniformity in the processes carried out on the wafer surface.

U.S. Pat. No. 5,350,479 to Collins et al. issued Sep. 27, 1994, and European Patent Application No. 93309608.3 of Collins et al., published Jun. 14, 1994, describe an electrostatic chuck for holding an article to be processed in a plasma reaction chamber. The electrostatic chuck includes a metal pedestal coated with a layer of dielectric material which contains a cooling gas distribution system for passing and distributing a cooling gas between the upper surface of the electrostatic chuck and an article supported on that surface. Typically, the dielectric material is alumina which is applied by a thermal spraying process to form a layer having a thickness greater than the final desired thickness, e.g. 15–20 mils (380–508 microns). After the dielectric material has been applied, it is ground back to a layer having a desired final thickness, for example, 7 mils (180 microns). The upper surface of the dielectric layer is then processed to provide a pattern of cooling gas distribution grooves over the surface of the layer and perforations through the dielectric layer which connect with cooling gas distribution cavities within the underlying aluminum pedestal.

An electrostatic chuck of the kind described in U.S. Pat. No. 5,350,479, and European Patent Application No. 93309608.3, referenced above, provides heat transfer from the semiconductor substrate being processed to the underlying electrostatic chuck. The problem then becomes one of controlling the temperature of the electrostatic chuck. The electrostatic chuck may have embedded heating elements for purposes of increasing the temperature of the chuck platen. The electrostatic chuck pedestal may also contain cooling fluid channels for decreasing the temperature of the electrostatic chuck pedestal. Use of such heating and cooling means in combination with a thermocouple enables the control of the electrostatic chuck pedestal. When the semiconductor substrate is at about 350° C. and the underlying pedestal is at about 250° C., it is necessary to find a cooling fluid which can function at this elevated temperature. Water is the preferred cooling fluid, but water boils at 100° C. even under atmospheric pressure.

The problem here is to find a way to pull heat away from a surface at a temperature of 250° C. or higher without the need to use specialized cooling fluids or high pressured fluid systems.

SUMMARY OF THE INVENTION

The present invention discloses an apparatus and method for transferring heat from a hot electrostatic chuck to an underlying cold plate. Further, the overall structure of the electrostatic chuck of the present invention permits both the thermal and pressure isolation of a high-temperature, vacuum process taking place on the upper surface of the electrostatic chuck from a low-temperature, atmospheric pressure heat transfer process taking place on the underlying, lower surface of the electrostatic chuck.

The heat transfer apparatus of the present invention comprises:

a) at least one heat transfer thermal well having a first surface in thermal contact with a surface of an electrostatic chuck body and a second surface in thermal contact with a cold body; and b) a lubricant between said second surface of said thermal well and said cold body.

A typical thermal well is a thin walled cylinder which is open at one end and closed at the other. The cylinder edge at the open end is in contact with the surface of the electrostatic chuck body. The closed end of the cylinder is typically a flat surface designed to transfer heat to an underlying cold plate.

In the more preferred embodiment of the heat transfer apparatus, the at least one thermal well is in thermal contact with the electrostatic chuck body through a heat transfer plate which is in thermal contact with the electrostatic chuck body and with the at least one thermal well. The heat transfer plate contains heat transfer fluid conduits and acts as a manifold for directing heat transfer fluid toward the upper surface of the electrostatic chuck.

When the contact between the thermal well and the electrostatic chuck body is accomplished by welding or brazing the open end of the thermal well to the electrostatic chuck surface or to the heat transfer plate, it is desirable to create an opening in the closed end of the thermal well to ensure that atmospheric pressure can be maintained inside the thermal well.

The preferred lubricant for use in an atmospheric pressure heat transfer process is a thermal grease. A preferred thermal grease contains a heat conductive material, typically particulate matter such a boron nitride or aluminum particles.

The present invention also includes an apparatus useful in semiconductor processing which comprises:

a) an electrostatic chuck body having a buried electrode for high voltage DC and RF electrical input, and a burled heating element which can be used to heat the electrostatic chuck;

b) a controlled heat transfer apparatus, including a heat transfer plate having a first surface in thermal contact with the electrostatic chuck body and a second surface in contact with at least one heat transfer thermal well; and c) a cold body in contact with the at least one heat transfer thermal well.

A preferred embodiment of the heat transfer thermal well is a thin walled cylinder of a heat conductive material which is in thermal contact with, and preferably attached at one end to a surface of a heat transfer plate used to transfer heat from the electrostatic chuck. The other end of the thin walled cylinder is typically attached to a base heat transfer surface. Applied to the thermal well base heat transfer surface is a thermal grease which permits that surface to slide over a cold body with which it is in contact. The electrostatic chuck expands when heated, moving the thermal wells outward in a radial direction. The cold body (such as a cold plate) is preferably maintained at room temperature (about 20°–25° C.). If the base heat transfer surface of the thermal wells cannot slide freely over the cold plate surface, extreme thermal stress develops and the electrostatic chuck cracks. The cold body is preferably a flat surface which makes relatively close contact with the heat transfer surface of the thermal well base, which is also preferably flat. Better heat transfer between the base heat transfer surface of the thermal well and the cold body is achieved when the thermal grease between them contains an agent to improve heat transfer, such as free metallic particles.

Thermal and pressure isolation of the electrostatic chuck body (which is located within the portion of the semiconductor processing chamber exposed to the plasma/vacuum environment) from the optional heat transfer plate, thermal wells and cold body is achieved by containing these latter elements within an envelope which is sealed against the portion of the electrostatic chuck exposed to the plasma/vacuum environment. The heat transfer plate is optional when it is not needed as a heat transfer fluid manifold.

In a preferred embodiment of the isolation feature of the invention, the envelope is created using a thin-walled cylinder, a first end of which is sealed against a surface of the electrostatic chuck which is not the work piece processing surface, and a second end of which is sealed against a wall of the semiconductor processing chamber in which the electrostatic chuck is operated. The linear expansion coefficient of the thin-walled cylinder material should be closely matched to the material of construction of the electrostatic chuck body. The volume enclosed within the thin-walled cylinder can be maintained under ambient atmosphere conditions, while the electrostatic chuck is operated in the plasma/vacuum environment. Use of an atmospheric pressure environment within the envelope surrounding the heat transfer plate provides a number of advantages. In the present instance, it enables utilization of the heat transfer apparatus, since a thermal grease cannot be used in a vacuum system where it vaporizes and contaminates surfaces within the system. In general, high voltage leads will break down in vacuum, so it is necessary to create atmospheric pressure feedthroughs or use solid dielectric with no vacuum gaps surrounding the leads. The same is hue for the AC lines used as the power source for heating elements. Further, use of an atmospheric pressure envelope reduces the possibility of corrosive attack of components such as wiring. In addition, there is no possibility of sputter contamination of exposed materials with Ni, Fe and other processing materials which can contaminate a subsequent semiconductor substrate or workpiece processed in the apparatus. Depending on the configuration of the semiconductor processing chamber which makes up part of the envelope, it is possible to leave at least a portion of the apparatus of the present invention open to the atmosphere so that servicing of any heat transfer connections is simplified. And, when the electrical wiring is also located within the portion of the apparatus open to the environment, the danger of arcing is greatly reduced and servicing of such electrical connections is made easier.

BRIEF DESCRIPTION OF THE DRAWINGS

FIG. 4A is a top view, looking at the upper dielectric surface of the electrostatic chuck of FIG. 3, including heat transfer fluid openings and fluid flow channels. FIG. 4A also shows the RF/HVDC electrical grid underlying the dielectric surface.

FIG. 6A illustrates a heat transfer plate/manifold which is attached to the lower portion of the electrostatic chuck shown in FIG. 4B. Attached to the bottom of the heat transfer plate/manifold are heat exchange thermal wells which transfer heat from the heat transfer plate/manifold to a cold plate in contact with the thermal wells.

DETAILED DESCRIPTION OF THE PREFERRED EMBODIMENTS

In accordance with the present invention, an apparatus and method are disclosed for transferring heat from a hot electrostatic chuck to an underlying cold plate. Further, the overall structure of the electrostatic chuck combined with the heat transfer apparatus of the present invention provides for the thermal isolation of the high-temperature, vacuum process chamber from the low-temperature, atmospheric-pressured portion of the apparatus which contains the heat transfer apparatus.

Figure 1:
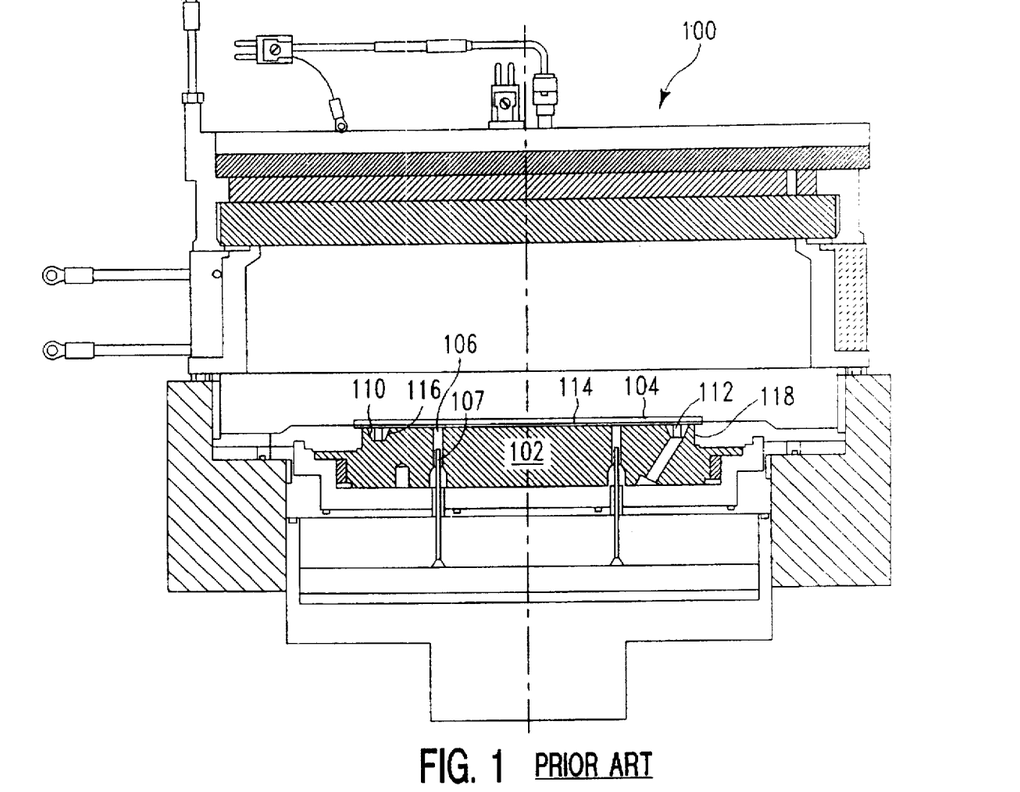
FIG. 1 illustrates a typical plasma processing chamber with a prior art electrostatic chuck in place within the chamber. This electrostatic chuck is generally operated at temperatures in the 65° C. range.

With reference to FIG. 1, which illustrates the prior art, a plasma processing chamber 100 contains an electrostatic chuck 102 which electrostatically clamps work piece 104 (typically a semiconductor wafer) in position within chamber 100 during processing. Electrostatic chuck 102 comprises lift finger openings 106 which contain lift fingers 107 which enable lifting the semiconductor wafer off the upper surface of electrostatic chuck 102 once the power has been turned off and the clamping force terminated.

Figure 2A:
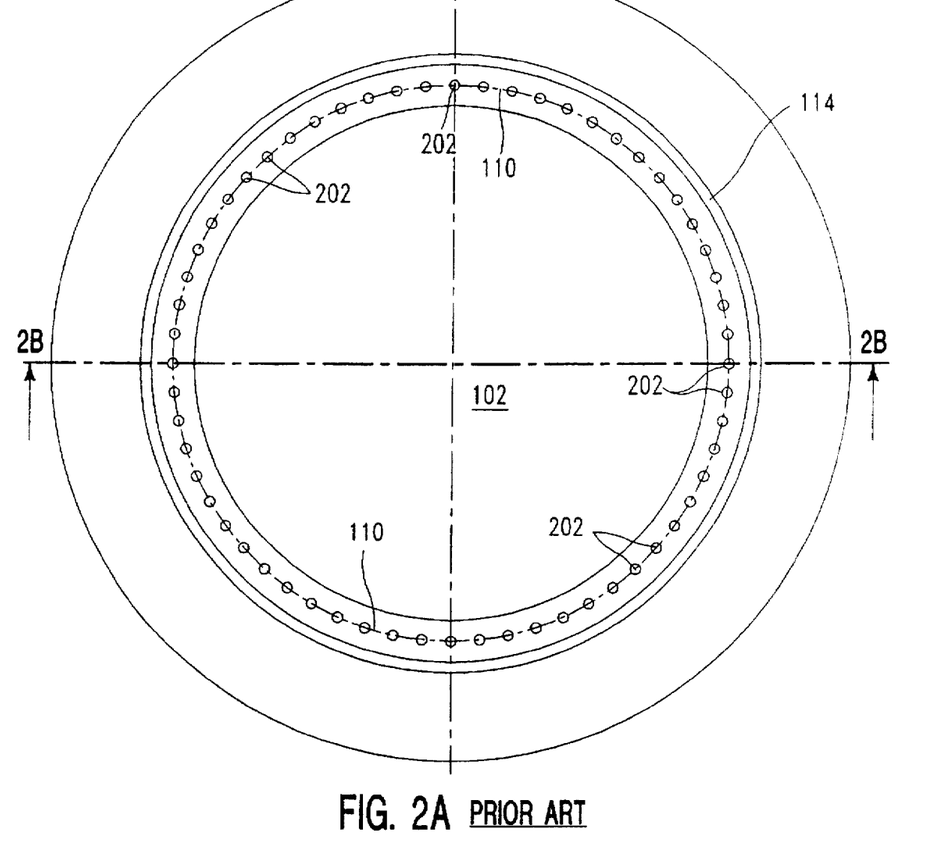
FIG. 2A shows a schematic top view of an electrostatic chuck of the kind shown in FIG. 1, including heat transfer fluid distribution holes or perforations arranged around the peripheral edge of the electrostatic chuck.
Figure 2B:
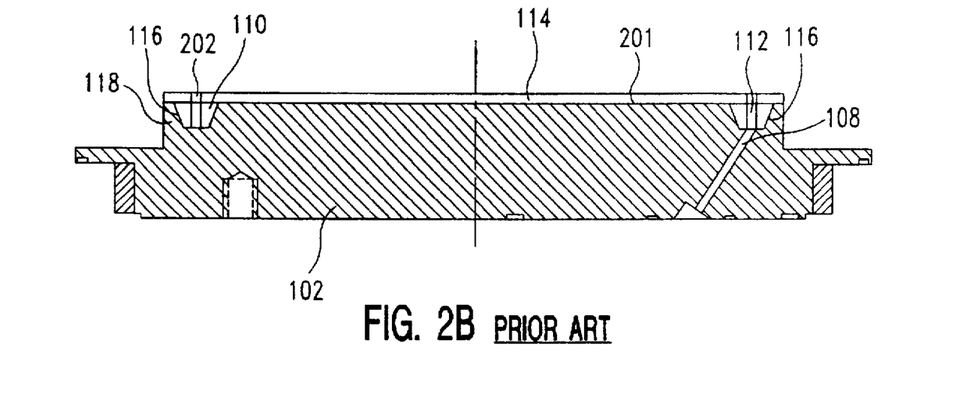
FIG. 2B is a schematic of a cross-sectional view of the electrostatic chuck of FIG. 2A.
Figure 2C:
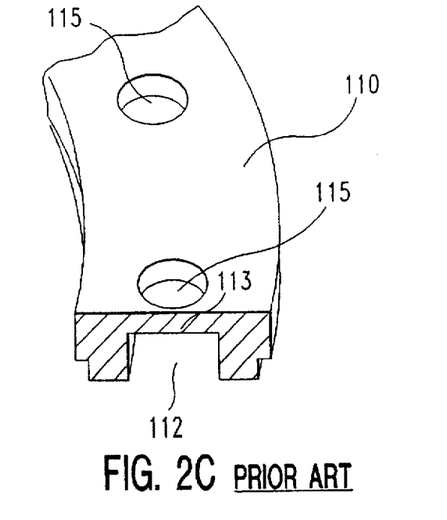
FIG. 2C is a schematic of a cross-sectional view of the gas distribution insert shown in FIG. 2A.

FIG. 2A shows a top view of electrostatic chuck 102, having an annular metallic insert 110 positioned near its periphery. Insert 110 sits inside a channel 116 machined into the surface 201 of pedestal 118 of electrostatic chuck 102. Insert 110 works in cooperation with channel 116 in the surface of pedestal 118 (See FIG. 2B) to provide a heat transfer fluid (typically cooling gas) flow channel 112 around the entire periphery of electrostatic chuck 102. The upper surface 201 of electrostatic chuck pedestal 118 is covered with a dielectric layer 114. FIG. 2C shows an enlarged cross-sectional view of metallic insert 110. To enable the flow of a heat transfer fluid from flow channel 112 and through dielectric layer 114, openings 115 are created through thin metallic layer 113 overlying flow channel 112. Further, as shown in FIG. 2B, openings 202 are created through dielectric layer 114 to connect with openings 115 through metallic insert 110 and flow channel 112 within metallic insert 110.

Typically an electrostatic chuck of the kind shown in FIGS. 1, and 2A through 2C is used at temperatures below about 100° C. A heat transfer fluid, such as a cooling gas, circulated through the flow channels described above aids in the transfer of heat from work piece 104, to electrostatic chuck 102, from which this heat needs to be removed. In addition, the application of biasing RF and chucking HVDC to electrostatic chuck 102 causes chuck 102 to heat up. This heat is removed using cooling water, with the electrostatic chuck 102 temperature controlled to operate at about 65° C. (the same temperature as the process chamber wall). The maximum temperature at which electrostatic chuck 102 can be operated is about 100° C. based on use of cooling water, and the temperature differential between a workpiece at about 350° C. and an electrostatic chuck operated over a range of about 65° C. to 100° C. is essentially the same (about 270 ° C). This large temperature differential results in a substantial driving force moving heat from the wafer toward the underlying electrostatic chuck. Further affecting heat transfer away from the wafer is the heat loss from the outer edge of the electrostatic chuck and the outer edge of the wafer. Under these conditions, it is not unusual to find a temperature differential from the center of the wafer toward its edge (radially) of about 75 ° C. In a high density plasma chemical vapor deposition processes, a 75° C. variation in temperature across the workpiece surface has significant effect on the processing and quality control of the devices created on work piece 104. For example, the thickness of a coating deposited on the wafer surface depends on the temperature of the surface on which it is deposited, and the coating thickness affects device performance characteristics.

It became apparent that it would be desirable to operate the electrostatic chuck at a temperature closer to that of the work piece, to obtain better uniformity of the workpiece surface temperature. For example, experimental data has shown that operation of the electrostatic chuck at a temperature within about 100° C. (or less) of the work piece enables the creation of uniform film thicknesses during high density plasma chemical vapor deposition. However, to enable control of the temperature of the electrostatic chuck, a means had to be found to ensure rapid heat removal when necessary, while maintaining careful control over the rate of heat removal, to reduce fluctuation in the electrostatic chuck temperature.

Figure 3A:
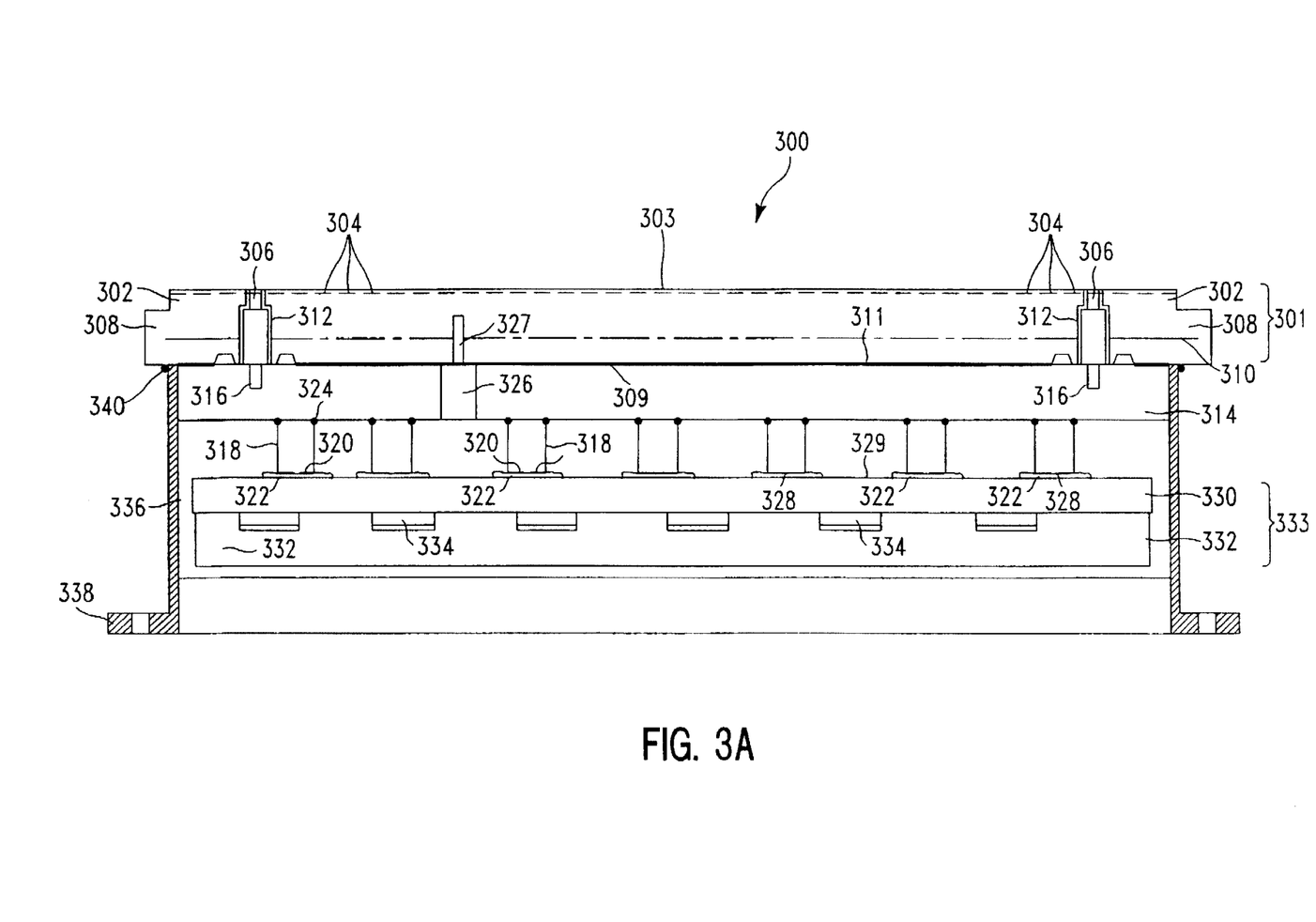
FIG. 3A is a schematic of a cross-sectional view of an assembly which includes an electrostatic chuck and a preferred embodiment of the heat transfer apparatus of the present invention, which is used to remove heat from the electrostatic chuck. Also included in the assembly is the vacuum isolation structure of the present invention which enables operation of the surface of the electrostatic chuck at a vacuum and high temperature, while electrical connections and the heat transfer apparatus of the present invention are operated at atmospheric pressure and a lower temperature.
Figure 3B:
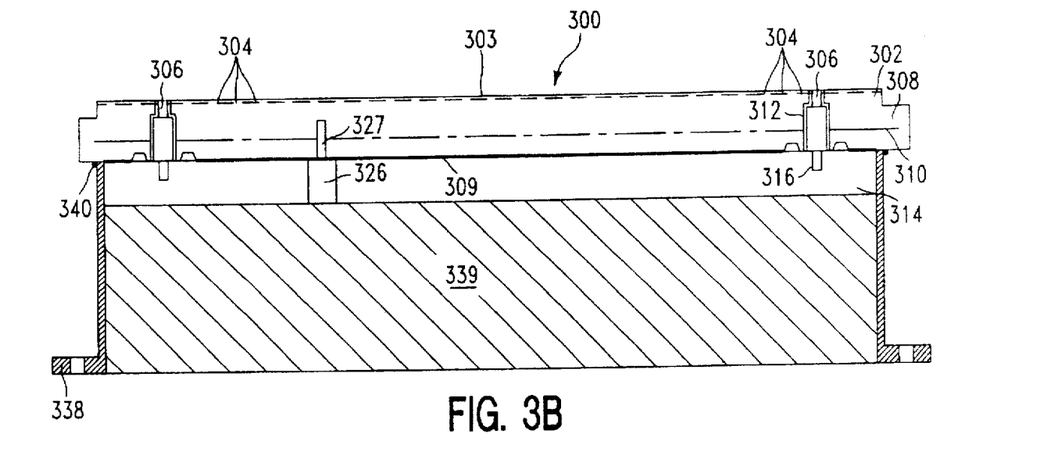
FIG. 3B is another schematic of the assembly shown in FIG. 3A which illustrates the portion of the assembly which is operated atmospheric pressure.

FIG. 3A shows a cross-sectional view of a preferred embodiment assembly 300 which includes an electrostatic chuck 301 typically comprising an upper region 302, and a lower region 308. Alternatively, electrostatic chuck 301 can be of a constant diameter. Also included in the assembly are heat transfer plate/manifold 314 which acts as a manifold to supply heat transfer gas to electrostatic chuck 301; heat transfer thermal wells 318 attached to heat transfer/manifold plate 314; and a cooling plate 333 having an upper member 330 brazed to a lower member 332 which includes cooling channels 334. Heat transfer/manifold plate 314, heat transfer thermal wells 318, and cooling plate 333 are housed within a thin-walled heat choke cylinder 336 which is brazed 340 to electrostatic chuck lower region 308. A flange 338 extends from (or is attached to) thin-walled heat choke cylinder 336. This flange 338 is sealed against a surface within the process chamber (not shown) in which the electrostatic chuck 301 is operated. A first volume formed inside thin-walled heat choke cylinder 336, between the lower brazed surface 309 of electrostatic chuck lower region 308 and the surface to which choke cylinder 336 is attached via flange 338 can be operated at atmospheric pressure. A second volume exterior to this first volume is operated under the vacuum conditions. FIG. 3B shows an atmospheric pressure cavity 339 located beneath heat transfer/manifold plate 314. In an application which did not require heat transfer/manifold plate 314, the first volume atmospheric pressure cavity would extend from the lower surface 311 of electrostatic chuck 301 and the surface to which flange 338 is attached.

The preferred embodiment electrostatic chuck 301 was operated at high temperature, typically approximately 250° C. to 275° C. during processing of a silicon wafer. heat transfer manifold plate 314 and thermal wells 318 transitioned from this temperature down to about 65° C. to 70° C., the typical temperature of cold plate 333. Heat choke cylinder 336 was hot (about 250° C. to 275° C.) at the top and cold (about 65 ° C. to 70° C.) at the bottom.

Operation of the heat transfer elements at atmospheric pressure provided a particular advantage by increasing the heat transfer rate from heat transfer/manifold plate 314, through thermal wells 318 and toward cooling plate 333. In addition, the electrical supply connections (not shown) to the RF/HVDC electrical grid 304 near the surface of electrostatic chuck 301 and to heating coil 310 were made to extend through heat transfer/manifold plate 314, and electrostatic chuck 301, as appropriate, so that the electrical supply connections were located within the first volume (atmospheric pressure cavity 339), reducing the possibility of arcing and providing easy access for maintenance purposes, as previously described. In addition, the connection(s) (not shown) to heat transfer fluid conduits 316 and 312 were also accessed within atmospheric pressure cavity 339, providing ease in maintenance to such connections.

Heat transfer gas, typically helium, was supplied to heat transfer fluid conduits 316 and 312 at a nominal pressure, i.e. about 4–8 Torr. Ceramic pins 306 sit inside heat transfer fluid conduits 312 to reduce the possibility of arcing from the lower surface of a silicon wafer (not shown) into conduits 312. Such arcing can lead to break down of the heat transfer gas, particularly helium. The heat transfer fluid between the lower surface of a silicon wafer and the upper surface 303 of electrostatic chuck 301 was relatively static. The helium flow rate ranged from about 0.5 to about 1.0 sccm, which represented the helium leak rate from beneath the silicon wafer around its peripheral edge.

In FIGS. 3A and 3B, ceramic pin 306 is shown sitting on the upper surface of heat transfer/manifold plate 314, directly over heat transfer fluid conduit 316. This was the structure used when the heat transfer gas was helium, which due to the size of the helium molecule, flowed easily between the bottom of ceramic pin 306 and the upper surface of heat transfer/manifold plate 314. Alternatively, the ceramic pin 306 can be designed to leave a space between the bottom of the pin and the upper surface of heat transfer/manifold plate 314 in instances where this is required to permit flow of the heat transfer gas to the upper surface 303 of electrostatic chuck 301. The shape of heat transfer conduit 312 and ceramic pin 306 as shown in FIGS. 3A and 3B is designed to trap ceramic pin 306 and to avoid a straight path from the upper surface 303 of electrostatic chuck 301 to the interior cavity of conduit 312. This helps prevent arcing of high density plasma into cavity 312 and the concurrent breakdown of the heat transfer gas (helium in this example).

Contact between the base 320 of thermal wells 318 and upper member 330 of cooling plate 333 is preferably made using a lubricant/interface contact material 322. Lubricant/interface contact material 322 enables the base 320 of thermal wells 318 to slide over the upper surface 329 of cooling plate upper member 330 as the electrostatic chuck 310 and heat transfer/manifold plate 314 expand and contract; further lubricant/interface contact material 322 fills any gap between the base 320 and the upper surface 329 of cooling plate upper member 330, so that heat transfer is facilitated across this boundary. In the preferred embodiment described herein, a thermal grease was used as the lubricant/interface contact material 322, since the pressure within cavity 339 was atmospheric pressure. If the pressure in cavity 339 is less than atmospheric pressure, the lubricant/interface contact material 322 must be a material which does not out-gas at the pressure of operation. The thermal grease used as the lubricant/interface contact material 322 in the preferred embodiment was filled with a heat transfer medium, aluminum particles, which proved to provide excellent heat conduction.

As previously mentioned, lubricant/interface contact material (preferably thermal grease) 322 permits the base 320 of thermal wells 318 to slide over the upper surface 329 of upper member 330 of cooling plate 333. Thus, when electrostatic chuck 301 expands and contracts in dimension differently from cooling plate 333, lubricant/interface contact material 322 ensures that minimal stress is created between thermal wells 318 and the upper surface 329 of cooling plate 333. In addition, intimate heat transfer contact is maintained between the base 320 of thermal well 318 and upper surface 329 of cooling plate 333. A difference in relative amount of thermal expansion and contraction between electrostatic chuck 301 and cooling plate 333 occurred frequently when cooling plate 333 was maintained at a relatively constant temperature between about 65° C. and 100° C. while the temperature of electrostatic chuck 301 was varied between about 250° C. and 350° C. as process conditions were changed.

Cooling plate 333 comprised conduits 334 which carried cooling fluid, typically water (not shown). During typical operation of the electrostatic chuck in a high density plasma environment, the cooling fluid was passed through cooling plate conduits 334 at a relatively constant rate, while the RF to the electrostatic chuck grid 304 or (more commonly) the current to heater coil 310 was increased in response to a controller which received input data from a thermocouple 326–327. The thermocouple 326–327 measurement of the temperature was within approximately 5 mm of the upper surface 303 of electrostatic chuck 301. The controller was a standard, commercially available SCR (silicon controlled rectifier) controller with a proportional integrating derivative (PID) loop. The controller used the thermocouple 326–327 input to calculate the rate at which the temperature of the electrostatic chuck surface was increasing or decreasing and signaled for an increase or decrease in power to the heater coil 310 based on this input. Although the measured temperature which was used to provide input to the controller in this instance was the temperature of the electrostatic chuck body 301, other measured temperatures could be used in the alternative, such as the temperature of the semiconductor substrate (not shown) in contact with electrostatic chuck body 301, or the temperature of a process variable such as the plasma.

Typically, the temperature of the electrostatic chuck was controlled to be near that of the plasma processing temperature, with excess heat build-up on the silicon wafer being transferred to the electrostatic chuck via the helium heat transfer fluid between the silicon wafer and the electrostatic chuck. Thus, when the electrostatic chuck began to heat up, power to the heater coil 310 was reduced so that cooling occurred via heat transfer from electrostatic chuck 301 through heat transfer/manifold plate 314 and thermal wells 318 to cooling plate 333. When the plasma was turned off at the end of a wafer processing cycle, and the electrostatic chuck began to cool, power to the heater coil 310 was increased so the electrostatic chuck temperature could be maintained at a level which reduced the time required between the processing of different wafers (i.e. the electrostatic chuck did not have to be reheated each time a processed wafer was removed and a new wafer was placed on the electrostatic chuck for processing). Thus, the electrostatic chuck temperature control mechanism of the present invention not only improved quality control over films deposited on a workpiece (silicon wafer) surface during high density plasma CVD, but it reduced the cycle time for processing of the workpiece as well.

Cooling plate 333 was held in place against the base 320 of thermal wells 318 by three screws (not shown) which extended into heat transfer plate 314. The three screws were hand tightened against shims (not shown) which control spacing between base 320 and cold plate 333, whereby the thickness of the thermal grease 322 within such spacing was controlled.

Preferred materials of construction for assembly 300 are as follows. Electrostatic chuck 301 is comprised of a dielectric material, preferably a dielectric ceramic such as silicon nitride or alumina. A typical thickness for electrostatic chuck 301 is about 17 mm. Electrical grid 304 is fabricated from a conductor such as molybdenum, tungsten, tungsten-molybdenum alloy or other material having a thermal coefficient of expansion similar to that of the dielectric used to fabricate electrostatic chuck 301. Heating coil 310 is typically comprised of molybdenum wire. Electrical contacts (not shown), which connect to electrical grid 304 or heating coil 310 are preferably fabricated from a conductor such as molybdenum. Heat transfer plate/manifold 314 is preferably formed from the same dielectric material as electrostatic chuck 318, but can be formed from any material having a similar linear thermal coefficient of expansion and exhibiting adequate heat transfer rate capability. Thermal wells 318 are constructed from a material which provides a good heat transfer rate while offering a linear thermal coefficient of expansion approaching that of heat transfer plate 314. For example, when electrostatic chuck 301 is constructed of silicon nitride, thermal wells 318 are typically constructed from molybdenum. Thermal wells 318 are braised 324 to heat transfer plate 314 using a brazing material such as silver/copper/titania. When electrostatic chuck 301 is silicon nitride and thermal wells 318 are molybdenum, this brazing material is particularly effective. Although it is not known to be required, thermal wells 318 comprise an opening 328 along their base 320 to prevent the formation of a vacuum interior to thermal well 318 during brazing of the thermal well 318 to heat transfer plate 314. This helps maintain a flat base 320 for thermal well 318.

Thermal grease 322 is typically comprised of a material such as silicone which is filled with boron nitride or aluminum particles, by way of example, and not by limitation.

Cooling plate 333 is typically formed from a material which is an excellent conductor of heat, such as, for example, copper or aluminum. Thin-walled (typical thickness is about 0.020 in. or 0.51 mm) heat choke cylinder 336 is fabricated from a material having a linear coefficient of thermal expansion similar to that of electrostatic chuck 301, for example, molybdenum when electrostatic chuck 301 is silicon nitride. Flange 338 can be an extension from thin-walled heat choke cylinder 336, but preferably exhibits a thicker wall (about 0.25 in. or 7.3 mm thick, for example) which is brazed to thin-walled cylinder 336. Typically flange 338 is also fabricated from the same material as thin-walled heat choke cylinder 336, but it can also be made from a more ductile material such as stainless steel.

Figure 4A:
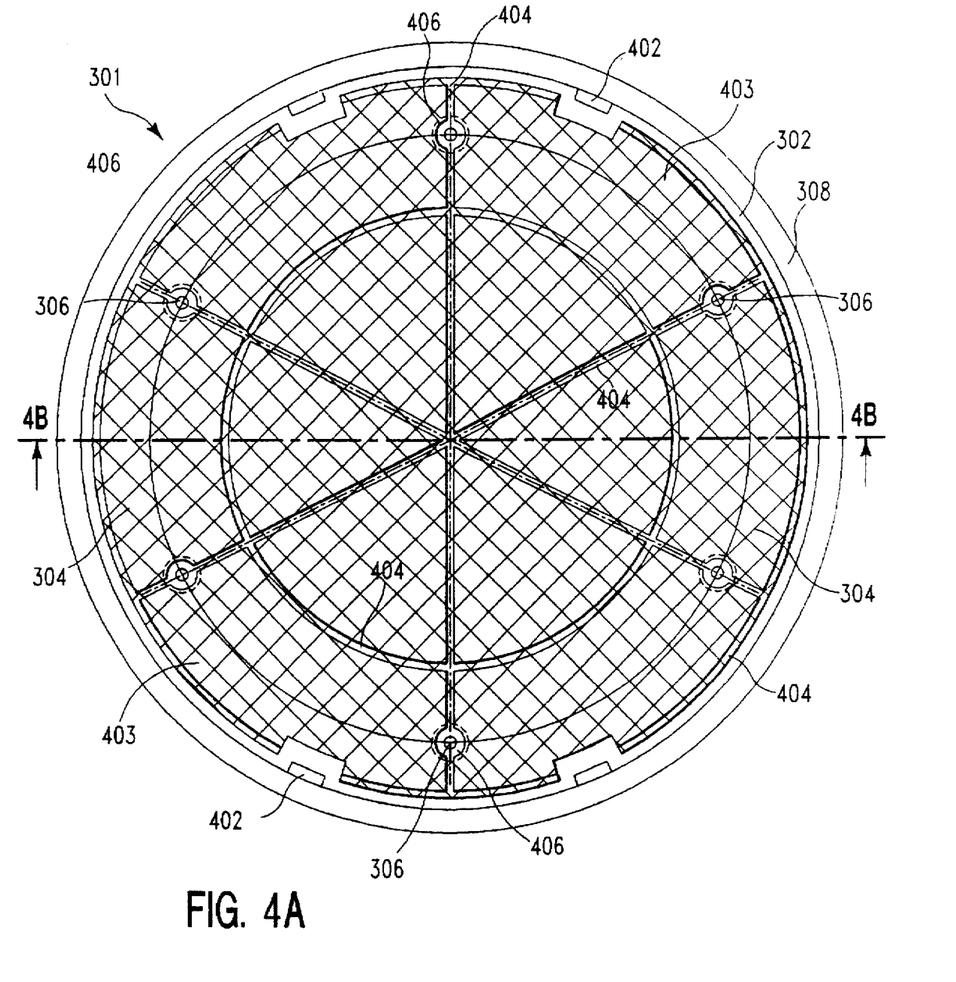
Figure 4B:
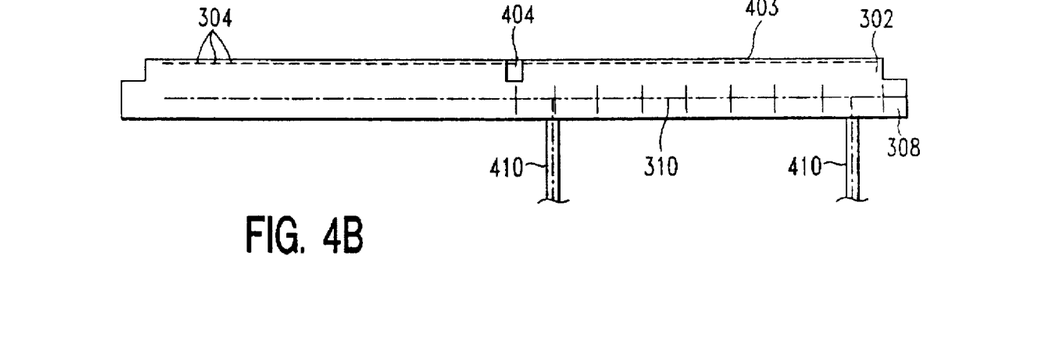
FIG. 4B is a schematic cross-sectional view of the electrostatic chuck of FIG. 4A. This cross-sectional view shows the RF/HVDC electrical grid near the upper surface of the electrostatic chuck and the electrical heating coil used for heating the electrostatic chuck, when desired.

FIG. 4A shows a top view of electrostatic chuck 301, while FIG. 4B shows a cross-sectional view which better illustrates upper region 302 and lower region 308 of electrostatic chuck 301, and electrical contacts 410. With reference to FIG. 4A, electrostatic chuck 301 includes lift finger pockets 402 which permit a work piece (not shown) to be raised and lowered relative to electrostatic chuck 301, for ease in handling during processing. Heat transfer fluid openings 406 extend to the upper surface 403 of upper region 302 of electrostatic chuck 301. Heat transfer fluid openings 406 surround ceramic pin 306 and are adjacent heat transfer fluid conduits 404 and 406 which lie on the upper surface 403 of upper region 302 of electrostatic chuck 301. Heat transfer fluid conduits 404 and 406 distribute a heat transfer fluid (such as a gas used for heating or cooling) over the entire upper surface 304 of electrostatic chuck 301. As previously described, the heat transfer gas is relatively static between the lower surface of a silicon wafer and the upper surface 403 of electrostatic chuck 301. The typical flow rate for a heat transfer gas such as helium is about 0.5 to about 1.0 sccm, which represents gas which leaks from around the edge of an eight inch (200 mm) diameter work piece (not shown) at a nominal helium pressure of about 4–8 Torr.

Electrical grid 304 lies beneath upper surface 403 and heat transfer fluid conduits 404 and 406 which are milled into upper surface 403. the thickness of the dielectric layer over electrical grid 304 is adequate to prevent electrical arcing between grid 304 and a workpiece (not shown) placed on upper surface 304 of electrostatic chuck 301, and to provide a breakdown voltage of at least 2 KV.

Figure 5:
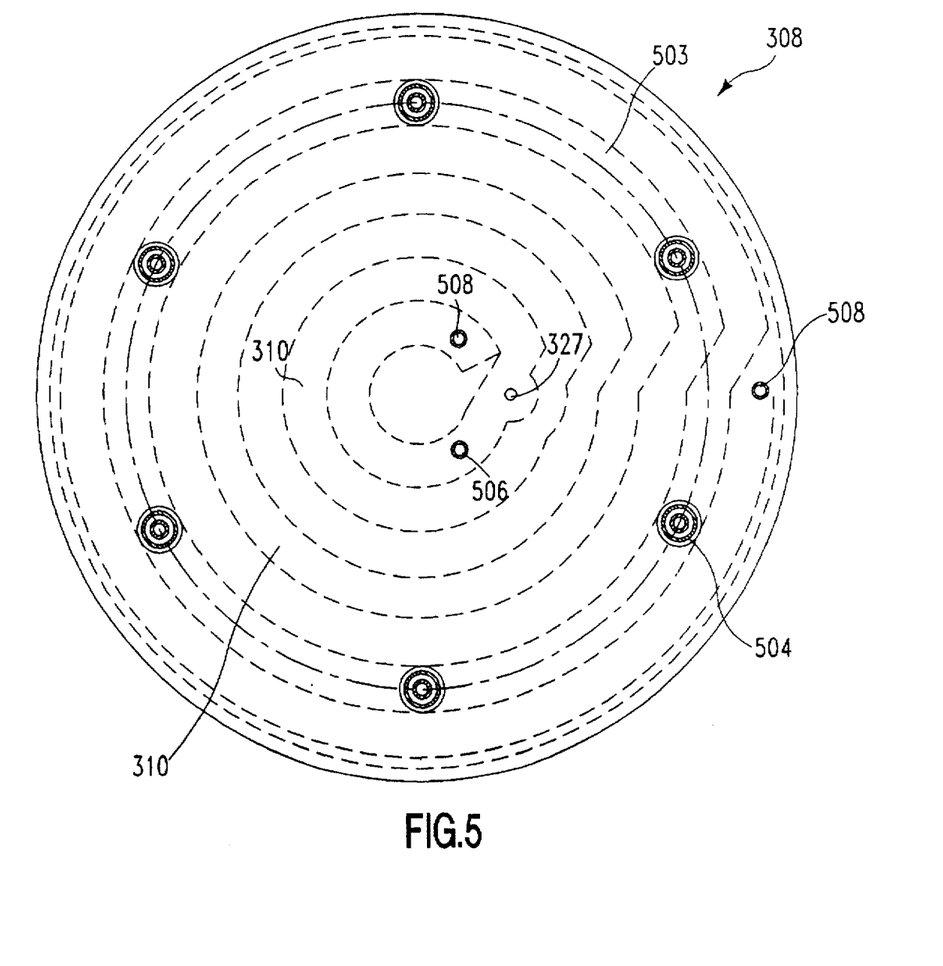
FIG. 5 shows a top view of the lower region 308 of the electrostatic chuck shown in FIG. 4B, illustrating the electrical heating coil, heat transfer fluid flow openings, electrodes for application of RF and high voltage DC current to the RE/HVDC electrical grid, and the thermocouple used to provide feedback for temperature control.

FIG. 5 shows the upper surface 503 of lower region 308 of electrostatic chuck 301. Heating coil 310 lies buried beneath upper surface 503. Electrical contacts 508 which connect with heating coil 310 are brazed bushings within the dielectric ceramic material of electrostatic chuck 301. Typically heating coil 310 is buried within the dielectric ceramic, then x-ray is used to locate the ends of heating coil 310. The dielectric ceramic is then milled to expose the ends of heating coil 310 which are brazed to bushings which make up electrical contacts 508. Electrical connection 506 to electrical grid 304 (not shown) is prepared in a similar manner. Thermocouple 327 enables the monitoring of the temperature of electrostatic chuck 301 within about 5 mm of its upper surface, as previously described. Thermocouple 327 passes through lower region 308 of electrostatic chuck 301 as shown in FIG. 5. Heat transfer fluid risers 504 which pass through lower region 308 of electrostatic chuck 301 enable the flow of heat transfer fluid to the upper surface (not shown) of electrostatic chuck 301.

Figure 6A:
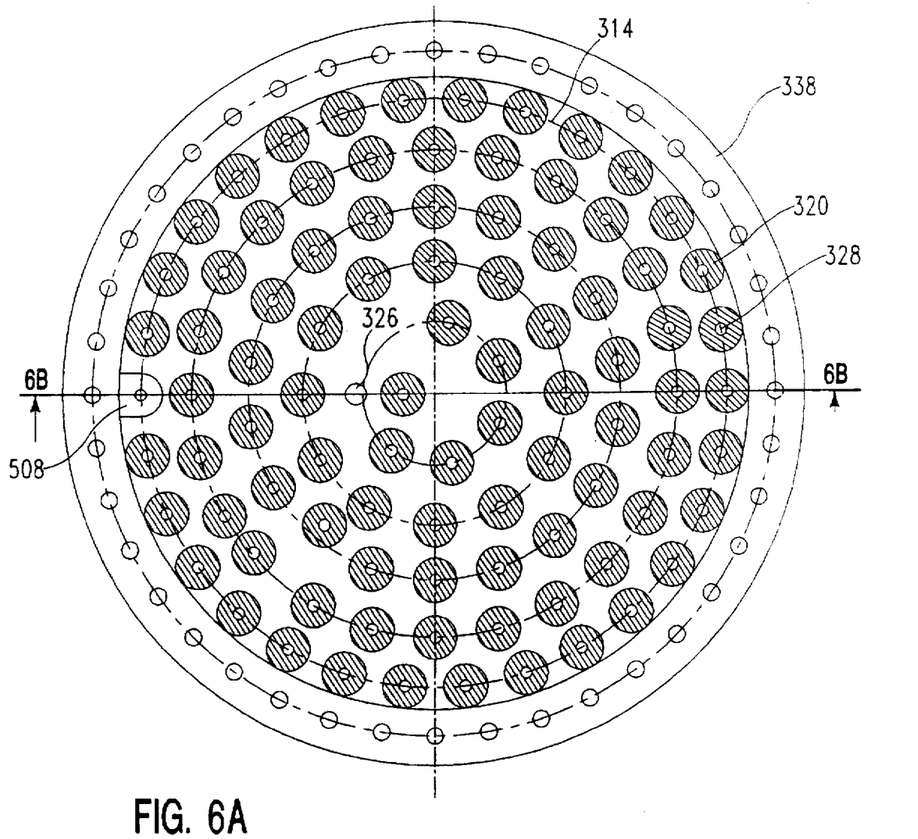
FIG. 6A shows a bottom view of a portion of the preferred embodiment heat transfer apparatus of the present invention.
Figure 6B:
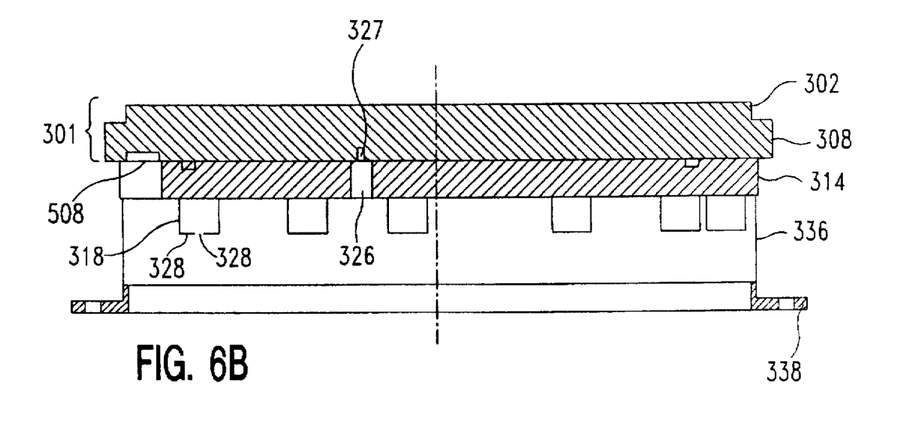
FIG. 6B is a schematic of a cross-sectional view of the electrostatic chuck layers shown in FIGS. 4A and 5A in combination with the heat transfer plate/manifold of FIG. 6A, assembled into a single structure. Also included in FIG. 6B is the thermal/vacuum isolation envelope used to isolate the electrostatic chuck substrate processing surface from the heat transfer apparatus of the present invention.

FIGS. 6A and 6B show the heat transfer plate/manifold 314 and thermal wells 318 of the heat transfer apparatus in relation to electrostatic chuck 301. FIG. 6A shows a bottom view of heat transfer plate/manifold 314, extending downward from electrostatic chuck lower region 308. The base 320 of heat transfer well 318 is more clearly illustrated, including opening 328 in the center of base 320. Also illustrated are the base 326 of thermocouple 326–327, and HVDC/RF connection 506. FIG. 6B shows a cross-sectional schematic of FIG. 6A, including electrostatic chuck 301, including upper region 302 and lower region 308; heat transfer plate/manifold 314; thermal wells 318 with base 320 and base center opening 328. Also illustrated are thermocouple 326–327, electrical connection 506 to grid 304, thin-walled heat choke cylinder 336 and mounting flange 338.

Assembly 300 described above preferably comprises silicon nitride electrostatic chuck upper members 302 and 308 and heat transfer plate 314, these members can be sintered together from "green sheet" material under about 100 atmospheres or more of pressure at about 200° C. However, depending on the composition of other elements located within the structure and their fragility, individual members formed under more gentle conditions can be brazed together. One skilled in the art can also envision the formation of a single silicon nitride-comprising member including elements such as the electrical grid, heating coil, electrical connections, heat transfer plate, heat transfer fluid conduits, and other elements, with the thermal wells brazed to the heat transfer plate subsequent to formation of the single silicon-nitride comprising member. Various layers and elements within the single member would be indexed and held in place mechanically during the molding/sintering process for preparation of the single member. Methods of preparation of such layered structures from ceramic "green sheet" and ceramic powder materials is well known in the art.

The above described preferred embodiments are not intended to limit the scope of the present invention, as one skilled in the art can, in view of the present disclosure expand such embodiments to correspond with the subject matter of the invention claimed below.

We claim:

1. A heat transfer apparatus useful in semiconductor processing, comprising:
    a) at least one heat transfer thermal well having a first surface in thermal contact with a surface of an electrostatic chuck body and a second surface in thermal contact with a cold body; and
    b) a lubricant between said second surface of said thermal well and said cold body.

2. The heat transfer apparatus of claim 1, wherein said lubricant is a thermal grease.

3. The heat transfer apparatus of claim 3, wherein said thermal grease contains a heat conductive material.

4. The heat transfer apparatus of claim 3, wherein said conductive material is selected from the group consisting of boron nitride particles and aluminum particles.

5. The heat transfer apparatus of claim 1, wherein said at least one thermal well is in thermal contact with said electrostatic chuck body through a heat transfer plate having a first surface in thermal contact at a with said electrostatic chuck body and a second surface in contact with said at least one thermal well.

6. An apparatus useful in semiconductor processing, comprising:
    a) An electrostatic chuck body having a buried electrode for high voltage DC and RF electrical input and a buried heating element, whereby the electrostatic chuck can be heated;
    b) a heat transfer apparatus, including a heat transfer plate having a first surface in thermal contact with said electrostatic chuck body and a second surface in contact with at least one heat transfer thermal well; and
    c) a cold body in contact with the at least one heat transfer thermal well.

7. The apparatus of claim 6, including as an additional element a lubricant between said at least one thermal well and said cold body which is in thermal contact with said thermal well.

8. The apparatus of claim 7, wherein said lubricant is a thermal grease.

9. The heat transfer apparatus of claim 8, wherein said thermal grease contains a heat conductive material.

10. The heat transfer apparatus of claim 9, wherein said conductive material is selected from the group consisting of boron nitride particles and aluminum particles.

11. The apparatus of claim 7, wherein said buried electrode is in the form of an electrical grid near the upper surface of said electrostatic chuck.

12. The apparatus of claim 6 wherein said electrostatic chuck comprises silicon nitride.

13. The apparatus of claim 6, wherein said heat transfer body is disk or plate shaped, and wherein said heat transfer body is braised to the lower surface of said electrostatic chuck.

14. The apparatus of claim 13, wherein said heat transfer body comprises silicon nitride.

15. The apparatus of claim 6, wherein said at least one heat transfer thermal well is braised at a first end to said heat transfer body.

16. The apparatus of claim 15, wherein said heat transfer thermal well includes a second end comprising a flat heat transfer surface.

17. The apparatus of claim 16, wherein said cold body has a flat heat transfer surface.

18. The apparatus of claim 17, including as an additional element a lubricant between said at least one thermal well flat heat transfer surface and said cold body flat heat transfer surface.

19. The apparatus of claim 18, wherein said lubricant is a thermal grease.

20. The heat transfer apparatus of claim 19, wherein said thermal grease contains a heat conductive material.

21. The heat transfer apparatus of claim 20, wherein said conductive material is selected from the group consisting of boron nitride particles and aluminum particles.

22. An apparatus useful in semiconductor processing, comprising:
    a) an electrostatic chuck body having a buried heating element, wherein the power to said heating element is controlled in response to a measured temperature of said electrostatic chuck body or to a measured temperature of a semiconductor substrate in thermal contact with said electrostatic chuck body; or to a measured temperature of a process variable; and
    b) a heat transfer apparatus including at least one heat transfer thermal well having a first surface in thermal contact with a surface of said electrostatic chuck body and a second surface in thermal contact with a cold body.

23. The apparatus of claim 22, wherein the poser to said heating element is controlled in response to said measured temperature of said electrostatic chuck body.

24. An apparatus useful in semiconductor processing, comprising:
    a) a high density plasma chemical vapor deposition processing chamber;
    b) an electrostatic chuck body having a buried heating element, wherein the power to said heating element is controlled in response to a measured temperature of said electrostatic chuck body or to a measured temperature of a semiconductor substrate in thermal contact with said electrostatic chuck body; or to a measured temperature of a process variable; and
    c) a heat transfer apparatus including at least one heat transfer thermal well having a first surface in thermal contact with a surface of said electrostatic chuck body and a second surface in thermal contact with a cold body.

25. A method of transferring heat from an electrostatic chuck, comprising:
    a) providing a surface of said electrostatic chuck from which heat is to be transferred;
    b) placing a first surface of at least one heat transfer thermal well in thermal contact with said surface of said electrostatic chuck.
    c) placing a second surface of said at least one heat transfer thermal well in thermal contact with a cold body.

26. The method of claim 25, including an additional step in which a lubricant is placed between said second surface of said at least one heat transfer thermal well and said cold body.

27. The method of claim 26, wherein said lubricant is a thermal grease.

28. A method of transferring heat from an electrostatic chuck located within a semiconductor processing chamber, comprising:
- a) providing an electrostatic chuck body having a buried heating element;
- b) controlling the power to said heating element in response to a measured temperature of said electrostatic chuck body or to a measured temperature of a semiconductor substrate in thermal contact with said electrostatic chuck body; or to a measured temperature of a process variable within said processing chamber;
- c) placing a first surface of at least one heat transfer thermal well in thermal contact with a surface of said electrostatic chuck body; and
- d) placing a second surface of said at least one heat transfer thermal well in thermal contact with a cold body.

29. An apparatus useful in semiconductor processing for providing thermal and pressure isolation of a work piece processing surface of an electrostatic chuck from a heat transfer apparatus for the removal of heat from said electrostatic chuck, said thermal and pressure isolation apparatus comprising: an envelope surrounding said heat transfer apparatus, said envelope having a first opening which is sealed against a portion of said electrostatic chuck surface which does not include the work piece processing surface, and a second opening which can be sealed against a surface in a processing chamber in which said electrostatic chuck is to be operated.

30. The apparatus of claim 29, wherein said envelope is created using a thin-walled cylinder, a first end of which is sealed against a surface of the electrostatic chuck which is not the work piece processing surface, and a second end of which is sealed against a wall of the semiconductor processing chamber in which the electrostatic chuck is operated.

31. The apparatus of claim 30, wherein the linear expansion coefficient of said thin-walled cylinder material is matched to the material of construction of the electrostatic chuck body.

32. A method useful in semiconductor processing for providing thermal and pressure isolation of the work piece processing surface of an electrostatic chuck from a heat transfer apparatus for removal of heat from said electrostatic chuck, said method comprising:
- a) placing a first surface of said heat transfer apparatus in sealing thermal contact with a surface of said electrostatic chuck other than said work piece processing surface;
- b) containing said heat transfer apparatus not in sealing contact with said surface of said electrostatic chuck within an envelope which can be sealed to isolate said heat transfer apparatus from said work piece-processing surface of said electrostatic chuck.

33. The method of claim 32, wherein said envelope comprises a thin-walled cylinder having a first end sealed against a surface of said electrostatic chuck adjacent the surface of said electrostatic chuck which is in sealing thermal contact with said heat transfer apparatus, in a manner which encompasses said heat transfer apparatus and a second end which permits said thin-walled cylinder to be sealed against a semiconductor processing chamber wall.

* * * * *